United States Patent
Takahashi et al.

(10) Patent No.: US 7,331,025 B2
(45) Date of Patent: Feb. 12, 2008

(54) DATA STORAGE METHOD AND DATA STORAGE DEVICE

(75) Inventors: Kazuhiko Takahashi, Kawasaki (JP); Taketoshi Omata, Kawasaki (JP); Kazuhito Honma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 410 days.

(21) Appl. No.: 11/149,261

(22) Filed: Jun. 10, 2005

(65) Prior Publication Data

US 2005/0229146 A1  Oct. 13, 2005

Related U.S. Application Data

(63) Continuation of application No. PCT/JP03/07374, filed on Jun. 10, 2003.

(51) Int. Cl.
*G06F 17/50* (2006.01)

(52) U.S. Cl. .................. 716/7; 716/1; 716/8; 716/11

(58) Field of Classification Search .................. 716/1, 716/7, 8, 11, 19
See application file for complete search history.

(56) References Cited

U.S. PATENT DOCUMENTS 7,006,670 B2 * 2/2006 Sumikawa et al. ......... 382/112

FOREIGN PATENT DOCUMENTS

| JP | 6-29199 | 2/1994 |
|----|---------|--------|
| JP | 6-151286 | 5/1994 |
| JP | 6-245085 | 9/1994 |
| JP | 8-279915 | 10/1996 |
| JP | 11-274025 | 10/1999 |

* cited by examiner

*Primary Examiner*—Thuan Do
(74) *Attorney, Agent, or Firm*—Staas & Halsey LLP

(57) ABSTRACT

In a data storage method and device, input data having a pattern are divided into a plurality of fields. A first number of rectangles contained in each field of an original image of the pattern is calculated by dividing the field of the original image into one or plurality of rectangles. A second number of rectangles contained in each field of an inverted image of the pattern is calculated by dividing the field of the inverted image into one or plurality of rectangles. One of pattern data of the original image and pattern data of the inverted image which has a smaller number of rectangles is selected by comparing the first number of the rectangles in the original image with the second number of the rectangles in the inverted image. The pattern data selected for each field are stored in a recording medium.

10 Claims, 10 Drawing Sheets

DATA STORAGE METHOD AND DATA STORAGE DEVICE

CROSS-REFERENCE TO RELATED APPLICATION

This application is a U.S. continuation application which is filed under 35 USC 111(a) and claims the benefit under 35 USC 120 and 365(c) of International Application No. PCT/JP2003/007374, filed on Jun. 10, 2003, the entire contents of which are hereby incorporated by reference.

BACKGROUND OF THE INVENTION

1. Field of the Invention

The present invention relates to a data storage method and data storage device for storing the pattern data of the photomask, such as the mask and the reticle, created in the semiconductor-device manufacturing processes.

2. Description of the Related Art

In recent years, as for the semiconductor-device manufacturing processes, such as the LSI manufacturing processes, the amount of data of the patterns, such as the photomask, is increasing with the use of smaller semiconductor devices.

Moreover, the graphic pattern compensation processing using the optical proximity correction (OPC) method etc. has become indispensable with the use of smaller graphic patterns, and this also makes the amount of data of the patterns increase further.

The photomask is a component through which a photosensitive film, deposited on the wafer, will then be exposed, in order to form the electronic circuit pattern for each layer of the IC. The photomask is commonly used in the photolithographic method for the semiconductor-device manufacturing processes when it is needed to transfer the circuit pattern to the wafer surface.

There are various kinds of the photomask created in the semiconductor-device manufacturing processes. The photomask may be roughly classified into the mask and the reticle. The mask is used wherein the circuit patterns each having the size equivalent to the size of the semiconductor device are formed on the photomask and they are transferred to the wafer surface by one operation. The reticle is used with the reduction projection exposure device (stepper).

Generally, both the former and the latter are collectively referred to as the photomask. In recent years, with the use of smaller semiconductor devices, the main current of the photomask which is more frequently used in the photolithographic method is the reticle.

In the conventional pattern data for the LSI manufacturing processes, the black and white pattern images are determined in accordance with the resist.

Moreover, there is the tendency in which the amount of data of the patterns, such as the photomask, increases with the complication of pattern form.

In addition, Japanese Laid-Open Patent Application No. 06-151286 discloses the method of exposure for the proximity effect correction in the electron beam exposure in which the multiple exposure is not used for the compensation exposure when the Ghost method is used.

Moreover, Japanese Laid-Open Patent Application No. 06-029199 discloses the method of creation of the inverted mask pattern data for preparing the photomask by exposing the resist to the beam exposure.

As mentioned above, as for the semiconductor-device manufacturing processes, such as the LSI manufacturing processes, the amount of data of the patterns, such as the photomask, is increasing with the use of smaller semiconductor devices.

According to the conventional data storage method, making determination as to whether the black pattern image or the white pattern image is selected for the pattern data storage is a fixed selection in accordance with the resist. Namely, when the pattern data are divided into a plurality of fields (which are the fixed regions preset in the data for exposure/inspection and hereinafter called the fields) and each pattern for every field is stored, the pattern of the fixed white or black image is stored for every field.

For example, when the pattern data of the white images are stored in accordance with the resist, the pattern of the white image is stored respectively for each field. On the contrary, when the pattern data of the black images are stored in accordance with the resist, the pattern of the black image is stored respectively for each field.

However, with the complication of pattern form, the number of the patterns to be stored in the white image for each field may be increased more than that in the case where they should be stored in the black image.

In this case, according to the conventional data storage method, the amount of the pattern data actually stored is beyond the necessary amount, and the problem arises in that the amount of the pattern data stored is unnecessarily increased.

It is conceivable that, in the near future, the countermeasure for the handling of large-scale data, the data transmission, or the data storage must be taken by the arrangement of the device environment or the like. It is expected that the costs, such as the plant-and-equipment investment, are increased for the arrangement of the device environment. Therefore, it is demanded that the costs needed for the arrangement of the device environment be reduced as much as possible.

SUMMARY OF THE INVENTION

An object of the present invention is to provide an improved data storage method and device in which the above-described problems are eliminated.

Another object of the present invention is to provide a data storage method and device for storing the pattern data created in the LSI manufacturing processes in which the pattern data can be stored in the required minimal amount.

In order to achieve the above-mentioned object, the present invention provides a data storage method which stores pattern data for manufacturing a semiconductor device, the data storage method comprising the steps of: dividing input data having a monochrome pattern into a plurality of fields; calculating a first number of rectangles contained in each of the plurality of fields of an original image of the monochrome pattern by dividing each field of the original image into one or plurality of rectangles; calculating a second number of rectangles contained in each of the plurality of fields of an inverted image of the monochrome pattern by dividing each field of the inverted image into one or plurality of rectangles; selecting, for each field, one of pattern data of the original image and pattern data of the inverted image which has a smaller number of rectangles, by comparing the first number of the rectangles constituting a corresponding field in the original image with the second number of the rectangles constituting a corresponding field in the inverted image; and storing the pattern data selected for each field in a recording medium.

Moreover, in order to achieve the above-mentioned object, the present invention provides a data storage device which stores pattern data for manufacturing a semiconductor device, the data storage device comprising: a field dividing unit dividing input data having a monochrome pattern into a plurality of fields; a first number calculating unit calculating a first number of rectangles contained in each of the plurality of fields of an original image of the monochrome pattern by dividing each field of the original image into one or plurality of rectangles; a second number calculating unit calculating a second number of rectangles contained in each of the plurality of fields of an inverted image of the monochrome pattern by dividing each field of the inverted image into one or plurality of rectangles; a number comparing unit selecting, for each field, one of pattern data of the original image and pattern data of the inverted image which has a smaller number of rectangles, by comparing the first number of the rectangles constituting a corresponding field in the original image with the second number of the rectangles constituting a corresponding field in the inverted image; and a data storing unit storing the pattern data selected for each field in a recording medium.

In the data storage method and device of the present invention, it is determined whether the pattern data having the smaller number of the rectangle patterns are the original white pattern or the original black pattern, for every field that is preset in the data for exposure/inspection, and the data of the pattern with the smaller number of the rectangle patterns are selected and stored.

According to the data storage method and device of the present invention, the data storage can be carried out in the required minimal amount as the pattern data of the photomask for manufacturing the semiconductor device. Therefore, the improvement of the data handling and the shortening of the data transfer time can be attained. Moreover, the hardware resources needed for the data storage, such as the external storage, can be effectively utilized.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the invention with reference to the accompanying drawings.

Figure 1:
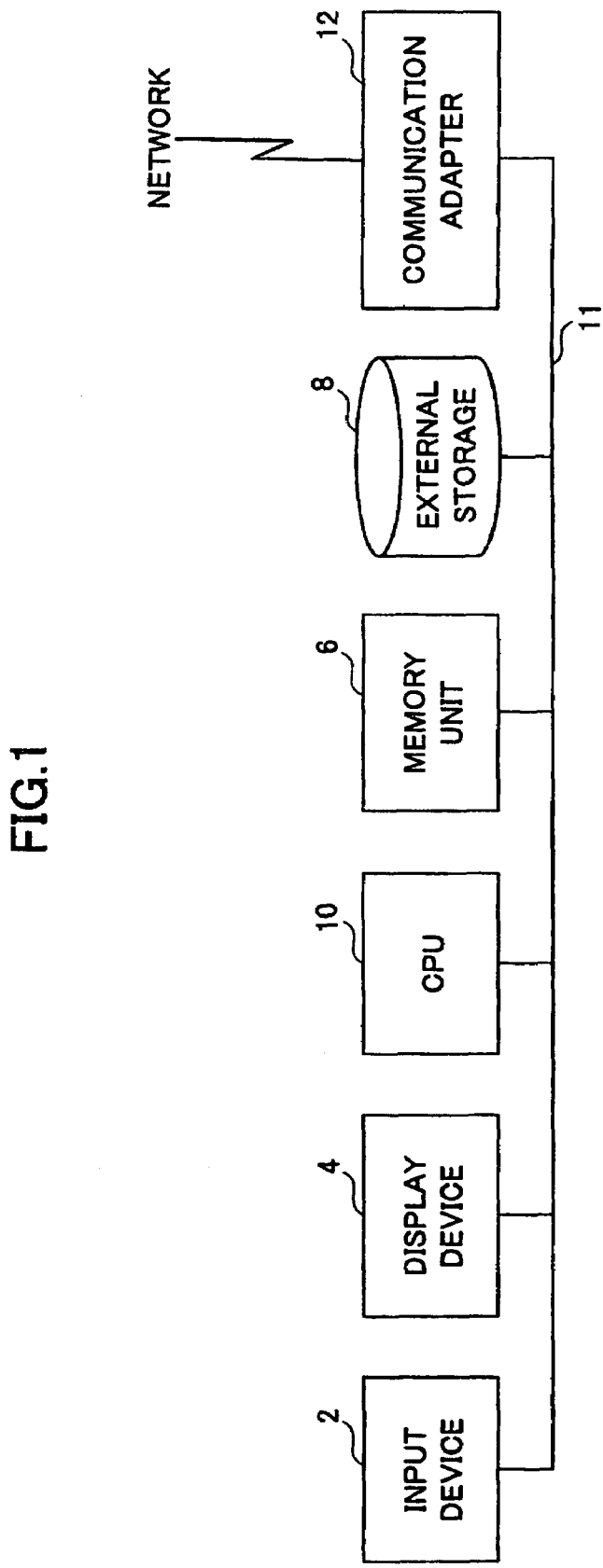
FIG. 1 is a block diagram showing the hardware composition of the data storage device in one preferred embodiment of the invention.

FIG. 1 shows the hardware composition of the data storage device in one preferred embodiment of the invention.

The data storage device of FIG. 1 comprises the input device 2, the display device 4, the memory unit 6, the external storage 8, the CPU 10, and the communication adapter 12. The input device 2, the display device 4, the memory unit 6, the external storage 8, the CPU 10, and the communication adapter 12 are interconnected by the bus 11.

The CPU 10 is a control unit which controls the whole data storage device of FIG. 1. Especially, the CPU 10 carries out the data storage program stored beforehand in the memory unit 6, in order to realize the data storage device (which will be described later) which stores the black and white pattern data of the photomask for manufacturing a semiconductor device, such as LSI, in the required minimal amount.

The input device 2 inputs the black and white pattern data of the photomask for manufacturing the semiconductor device and makes the data stored in the recording medium of the external storage 8.

Alternatively, the image data of the black and white patterns to be inputted may be recorded on the recording medium beforehand, and the recording medium may be read using the external storage 8.

Alternatively, by communicating with the external terminal via the network from the communication adapter 12, the image data of the black and white patterns to be inputted may be received from the external terminal and the received data may be recorded on the recording medium of the external storage 8.

The display device 4 displays the image data of the black and white patterns of the photomask, which are processed according to the data storage program, on the display monitor.

Figure 2:
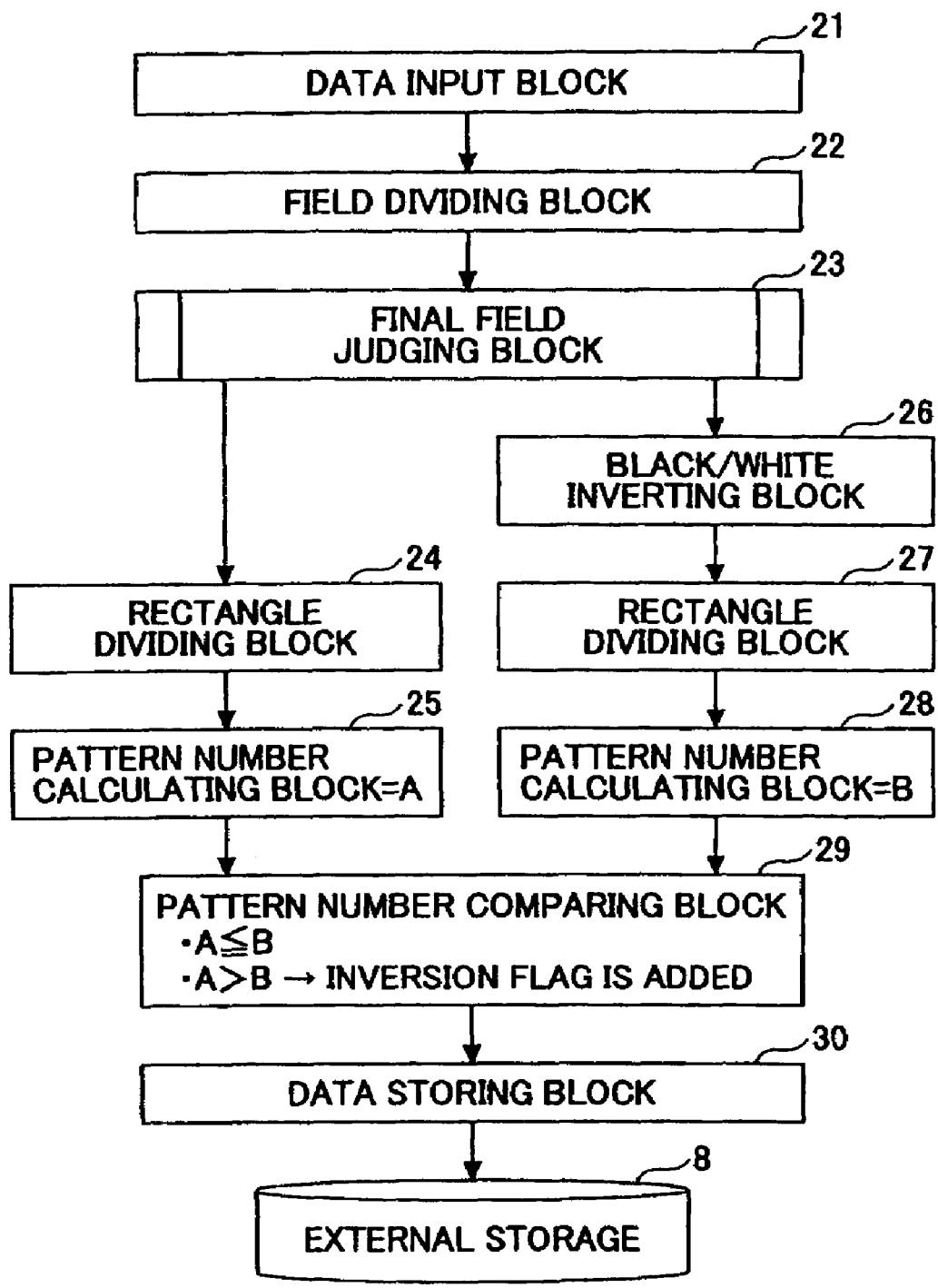
FIG. 2 is a block diagram of the functional composition of the data storage device in one preferred embodiment of the invention.

FIG. 2 shows the functional composition of the data storage device in one preferred embodiment of the invention.

As mentioned above, the data storage device of FIG. 2 stores the data of the black and white patterns of the photomask in the required minimal amount by executing the data storage program by the CPU 10 of FIG. 1.

As shown in FIG. 2, the data storage device of this embodiment comprises the data input block 21, the field dividing block 22, the final field judging block 23, the rectangle dividing block 24, the pattern number calculating block 25, the black/white inverting block 26, the rectangle dividing block 27, the pattern number calculating block 28, the pattern number comparing block 29, and the data storing block 30.

In the data storage device of FIG. 2, the data-input block 21 inputs the data of the monochrome (black and white) patterns of the photomask for manufacturing the semiconductor device, using the input device 2.

The field dividing block 22 carries out the field dividing of the whole data of the inputted black and white patterns into the plurality of fields. The plurality of fields are fixed and preset in the data for exposure/inspection.

Respective processing procedures by the above-mentioned blocks 23-30 are performed for each of the plurality of fields of the inputted pattern data after the field dividing is performed.

The final field judging block 23 determines whether one field (the field of concern) taken out of the plurality of fields divided by the field dividing block 22 is the final field of the input data.

When the field of concern is not the final field, the respective processing procedures by the above-mentioned blocks 24-30 are performed for the field of concern.

On the other hand, when it is the final field, the data of the final field (the field of concern) is stored, and then the processing of the whole data of the inputted the black and white patterns is completed.

The rectangle dividing block 24 divides the black pattern (normal image) of the field of concern into one or plurality of black rectangle patterns.

The pattern number calculating block 25 calculates the number A of the black rectangle patterns contained in the black pattern of the original image of the field of concern divided by the rectangle dividing block 24.

The black/white inverting block 26 creates the inverted image which is the reversal of the original image of the monochrome pattern of the field of concern.

The rectangle dividing block 27 divides into one or plurality of black rectangle patterns the black pattern of the inverted image created by the black/white inverting block 26. This black pattern of the inverted image corresponds to the original white pattern of the field of concern.

The pattern number calculating block 28 calculates the number B of the black rectangle patterns contained in the black pattern of the inverted image of the field of concern divided by the rectangle dividing block 27. As mentioned above, the black pattern of the inverted image in this case also corresponds to the original white pattern.

The pattern number comparing block 29 carries out comparison of the number A of the black rectangle patterns (which constitute the original black pattern) computed by the pattern number calculating block 25 and the number B of the black rectangle patterns (which constitute the original white pattern) computed by the pattern number calculating block 28, and selects one of the two pattern data with the smaller number.

Specifically, when $A \leq B$, the pattern number comparing block 29 selects the pattern data of the original black pattern. When A>B, the pattern number comparing block 29 selects the pattern data of the original white pattern. In addition, in the case of the latter (when the pattern data of the original white pattern are selected), the pattern number comparing block 29 adds the inversion flag information indicating that the original pattern image is inverted, to the pattern data of the original white pattern.

The data storing block 30 stores the pattern data selected by the pattern number comparing block 29 into the recording medium of the external storage 8 as the pattern data for the field of concern. At the time of the data storage, if the pattern data of the original white pattern are selected, the inversion flag information is also stored in the recording medium of the external storage 8 together with the pattern data for the field of concern.

As described above, when the field of concern is not the final field, the respective processing procedures by the above-mentioned blocks 24-30 are performed repeatedly. When the field of concern is the final field, the data storage of the final field (the field of concern) is completed, and then the processing of the whole data of the inputted black and white patterns is completed.

In the data storage device of FIG. 2, when the pattern data (inverted image) of the original white pattern are selected, the inversion flag information is stored in the recording medium together with the pattern data for the field of concern.

Therefore, when the pattern data of one of the plurality of fields is read from the recording medium and the presence of the inversion flag information stored for the field is detected, the inversion flag information is used to reproduce the original image of that field of the monochrome pattern by inverting an image of the read pattern data.

As described above, in the data storage device of FIG. 2, it is determined whether the pattern data having the smaller number of the rectangle patterns are the original white pattern or the original black pattern for every field that is preset in the data for exposure/inspection, and the pattern data with the smaller number of the rectangle patterns are selected and stored. According to the data storage device of FIG. 2, the data storage can be carried out in the required minimal amount as the pattern data of the photomask for manufacturing the semiconductor device. The amount of the pattern data which must be stored in the recording medium according to the data storage device of the present embodiment can be reduced to the level which is rather smaller than that of the conventional data storage method. Therefore, the improvement of the data handling and the shortening of the data transfer time can be attained. Moreover, the hardware resources needed for the data storage, such as the external storage, can be effectively utilized.

Figure 3:
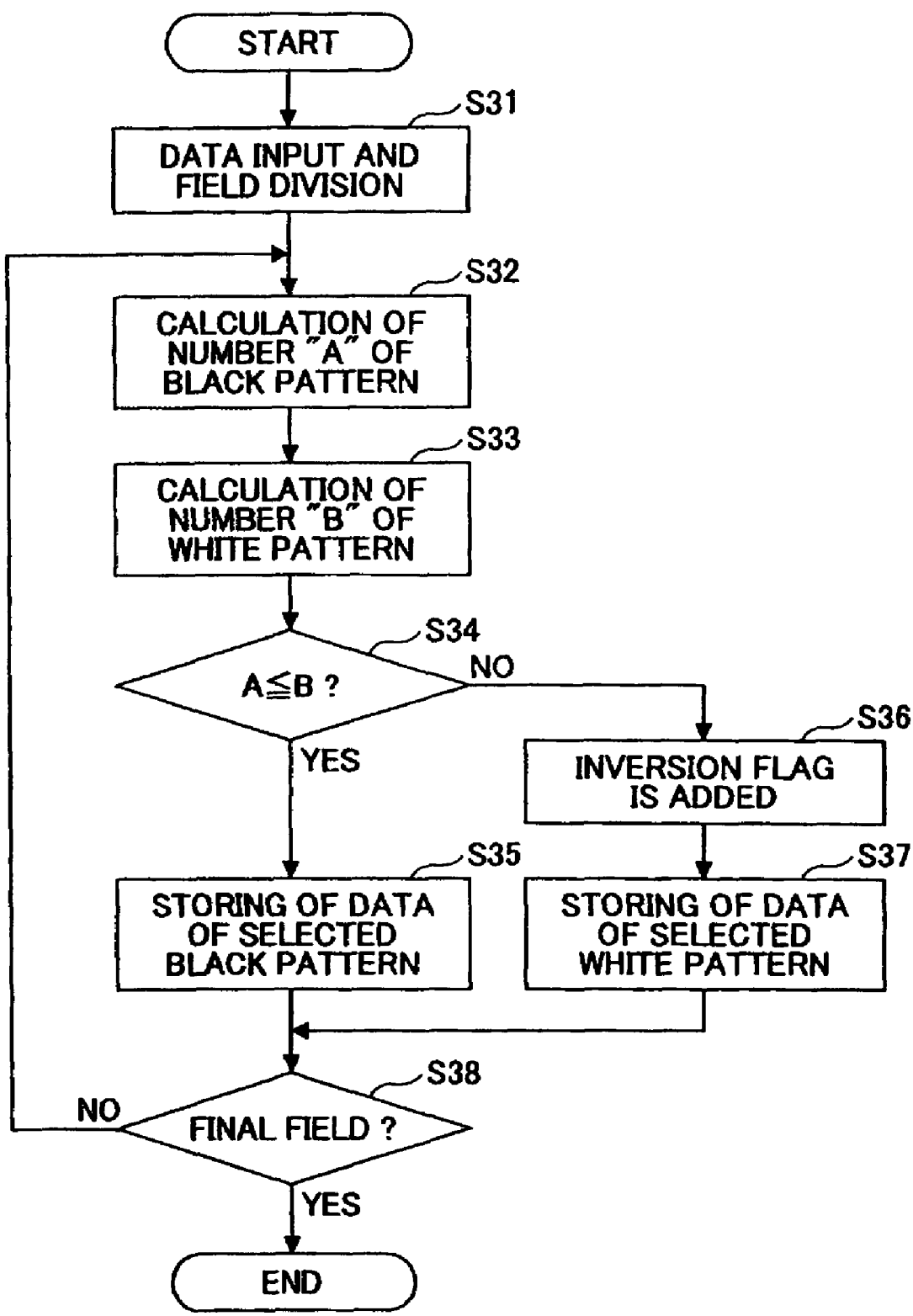
FIG. 3 is a flowchart for explaining operation of the data storage method in one preferred embodiment of the invention.

FIG. 3 is the flowchart for explaining operation of the data storage method in one preferred embodiment of the invention.

Similar to the embodiment of FIG. 2, the data storage method of FIG. 3 stores the pattern data of the black and white patterns of the photomask for manufacturing the semiconductor device, in the required minimal amount in accordance with the data storage program executed by the CPU 10 of FIG. 1.

When the operation of the data storage method of FIG. 3 starts, the CPU 10 in step S31 inputs the data of the black and white patterns of the photomask for manufacturing the semiconductor device, using the input device 2. And, in step S31, the field dividing of the whole data of the inputted black and white patterns is performed to create the plurality of fields (which are the fixed fields preset in the data for exposure/inspection).

The following respective steps are performed for each of the plurality of fields of the inputted pattern data.

In step S32, the CPU 10 divides the black pattern (normal image) of one field (the field of concern) among from the plurality of fields (obtained at the step S31) into one or plurality of black rectangle patterns, and calculates the number A of the black rectangle patterns contained in the black pattern of the original image of the field of concern.

In step S33, the CPU 10 creates the inverted image which is the reversal of the original image of the monochrome pattern of the field of concern, divides the resulting black pattern of the inverted image (corresponding to the original white pattern) into one or plurality of black rectangle patterns, and calculates the number B of the black rectangle patterns contained in the black pattern of the inverted image (corresponding to the original white pattern) of the field of concern.

In step S34, the CPU 10 determines whether the number A of the black rectangle patterns (constituting the original black pattern) obtained at the step S32 is smaller than or equal to the number B of the black rectangle patterns (constituting the original white pattern) obtained at the step S33.

When the judgment result of the step S34 is YES (A≦B), the CPU 10 in step S35 selects the pattern data of the original black pattern and stores the selected pattern data in the recording medium of the external storage 8 as the pattern data for the field of concern. After the step S35 is completed, the control of the CPU 10 is transferred to the next step S38.

On the other hand, when the judgment result of the step S34 is NO (A>B), the CPU 10 in step S36 selects the pattern data of the original white pattern, and adds the inversion flag information indicating that the original pattern image is inverted, to the selected pattern data.

After the step S36 is completed, the CPU 10 in step S37 stores both the inversion flag information (added at the step S36) and the selected pattern data in the recording medium of the external storage 8 as the pattern data for the field of concern. After the step S37 is completed, the control of the CPU 10 is transferred to the next step S38.

In step S38, the CPU 10 determines whether the field of concern is the final field of the input data among the plurality of fields which are created at the step S31. When the judgment result of the step S38 is NO (when the field of concern is not the final field), the control of the CPU 10 is returned to the step S32, and the procedures of the above-mentioned steps S32-S37 are repeated for the pattern data of the next field.

When the judgment result of the step S38 is YES (when the field of concern is the final field), the processing of the whole data of the inputted black and white patterns is completed.

According to the data storage method of FIG. 3, the data storage can be carried out in the required minimal amount as the pattern data of the photomask for manufacturing the semiconductor device. The amount of the pattern data which must be stored in the recording medium according to the data storage method of the present embodiment can be reduced to the level which is rather smaller than that of the conventional data storage method.

Figure 4:
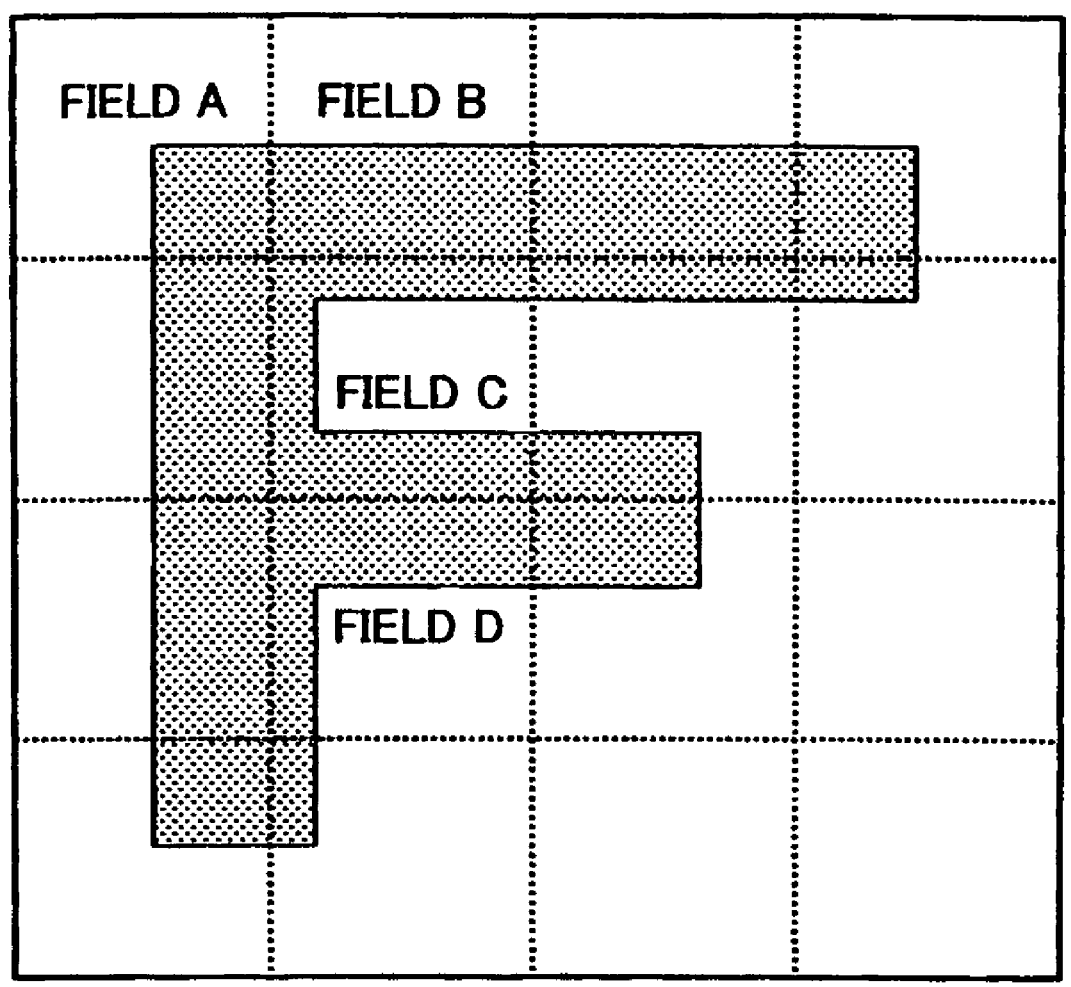
FIG. 4 is a diagram showing an example in which a graphic pattern data is divided into a plurality of fields.

Next, FIG. 4 shows an example in which a graphic pattern data of a photomask for manufacturing a semiconductor device, such as LSI, is divided into a plurality of fields.

Assuming that the graphic pattern data of FIG. 4 is the whole image of the photomask, the case in which the field dividing is performed into the plurality of fields A, B, C, and D (which are indicated by the dotted lines on the grid-like grid in FIG. 4 shows) will be explained.

FIG. 5, FIG. 6, FIG. 7, and FIG. 8 are diagrams for explaining the examples of the processing performed for the fields A, B, C, and D in the graphic pattern data of FIG. 4, respectively. In FIG. 5, FIG. 6, FIG. 7, and FIG. 8, (a) shows the state in which the rectangle dividing of the original black pattern is performed, (b) shows the state in which the rectangle dividing of the original white pattern is performed, (c) shows the result of comparison and judgment of the number of the rectangles, and (d) shows the pattern data to be stored, respectively.

As shown in FIG. 5 through FIG. 8, while the rectangle dividing of the original black pattern and the calculation of the number A of the divided rectangle patterns are performed for every field, the rectangle dividing of the inverted image pattern (corresponding to the original white pattern which is displayed in black for the sake of convenience) and the calculation of the number B of the divided rectangle patterns are performed for every field.

Moreover, the comparison and judgment of the number A of the rectangle patterns and the number B of the rectangle patterns which are computed is carried out, and the original pattern having the smaller number of the rectangle patterns is selected as being the pattern data of the field of concern and the data of the selected pattern is stored in the recording medium.

Figure 5:
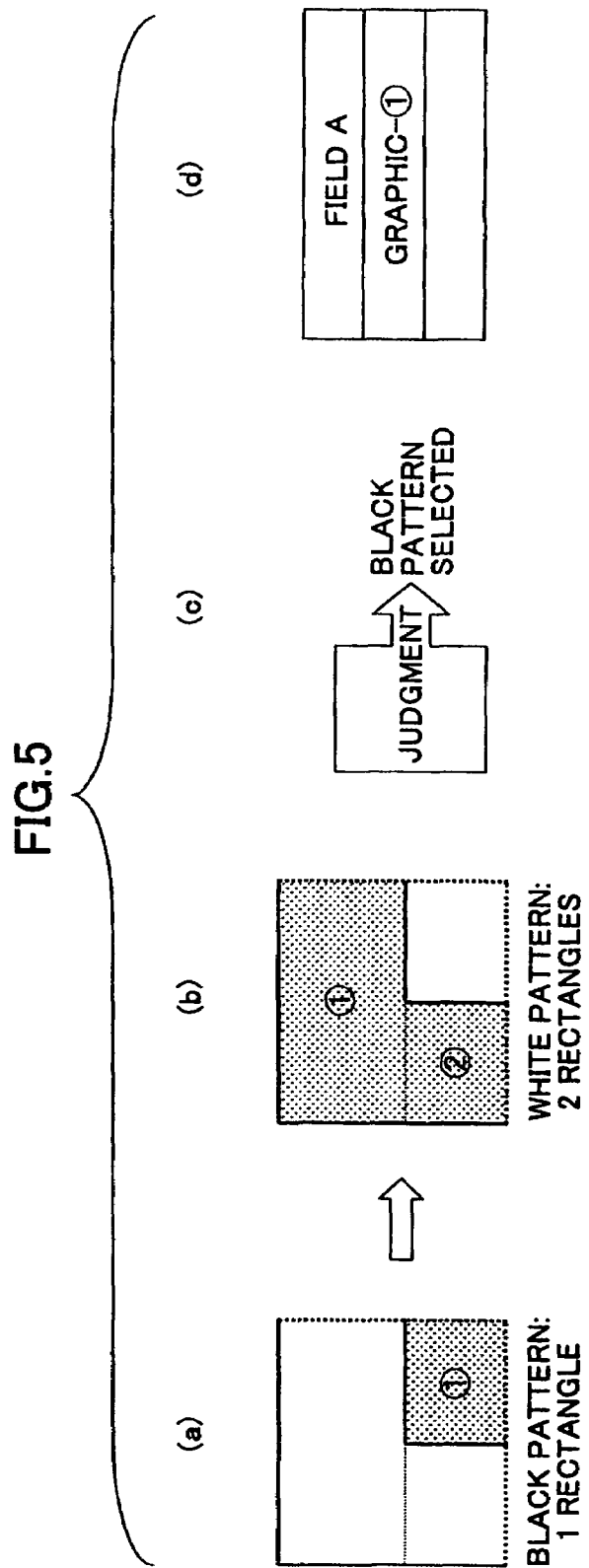
FIG. 5 is a diagram for explaining the example of the processing which is performed for the field A in the graphic pattern data of FIG. 4.
Figure 6:
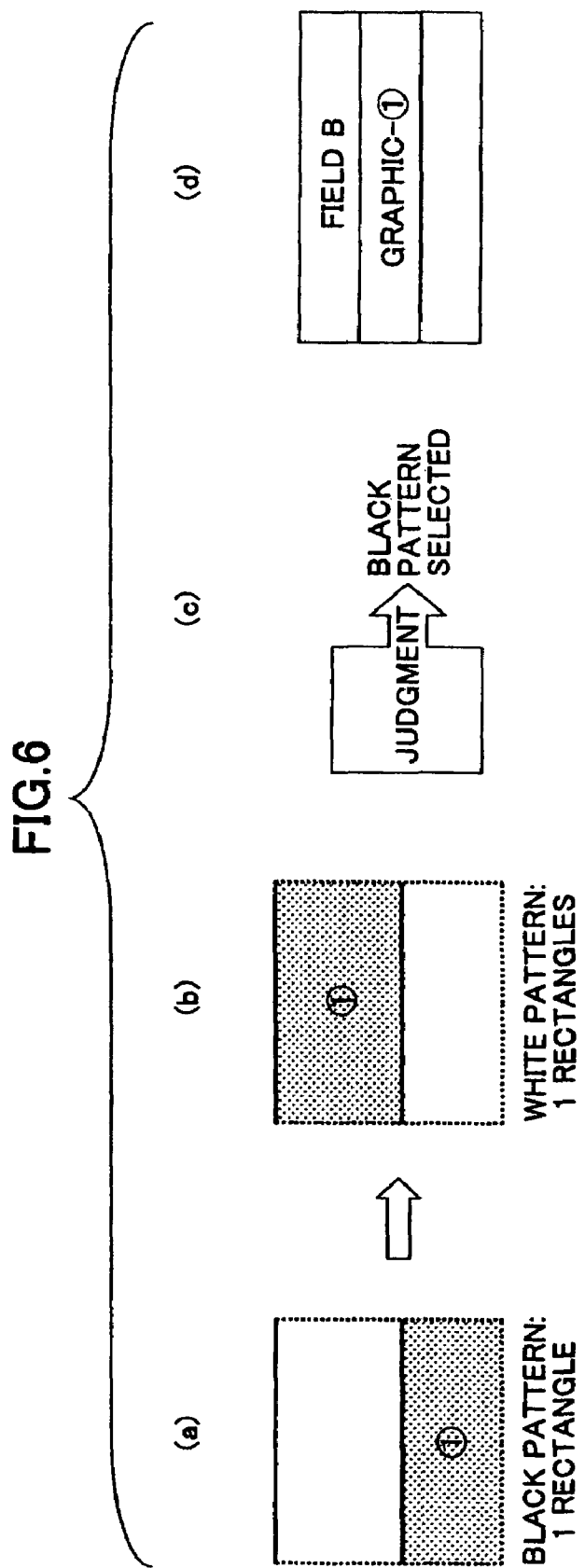
FIG. 6 is a diagram for explaining the example of the processing which is performed for the field B in the graphic pattern data of FIG. 4.

As shown in FIG. 5 and FIG. 6, concerning the field A and the field B, the number of the rectangle patterns contained in the original black pattern is smaller or equal, and the pattern data of the fields of the original black pattern are stored as the monochrome image of the original graphic pattern (the black pattern is registered).

Figure 7:
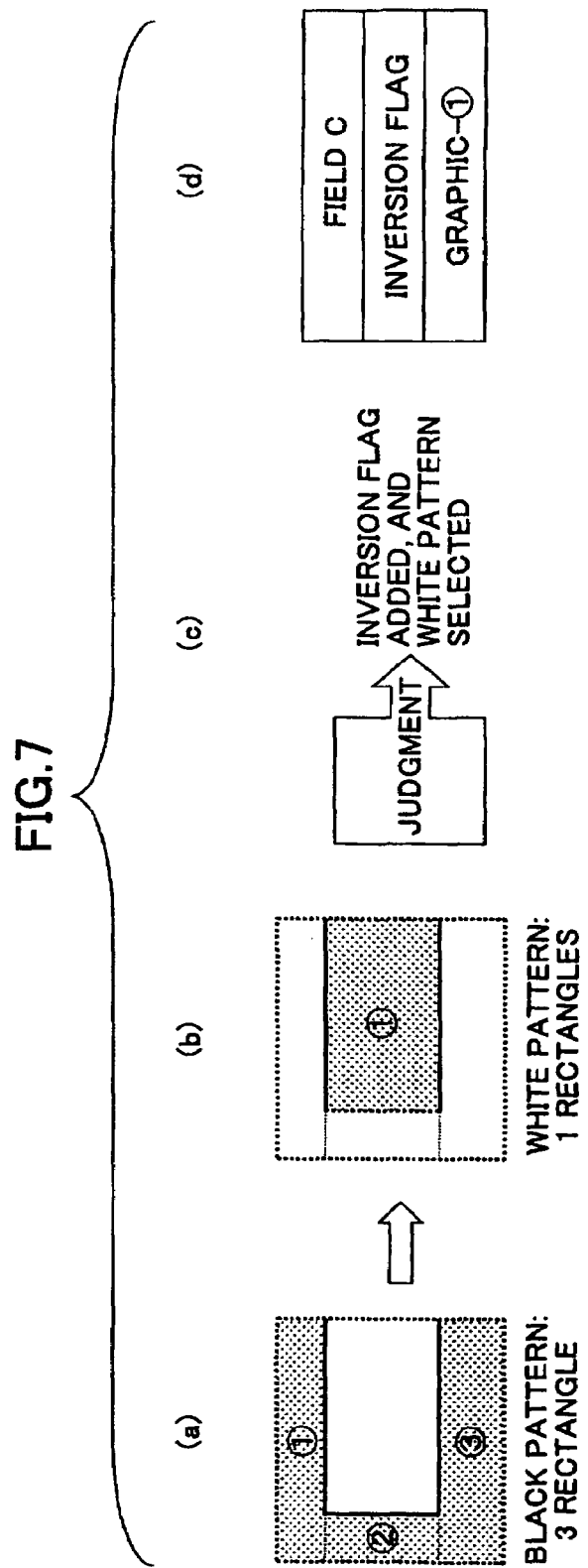
FIG. 7 is a diagram for explaining the example of the processing which is performed for the field C in the graphic pattern data of FIG. 4.
Figure 8:
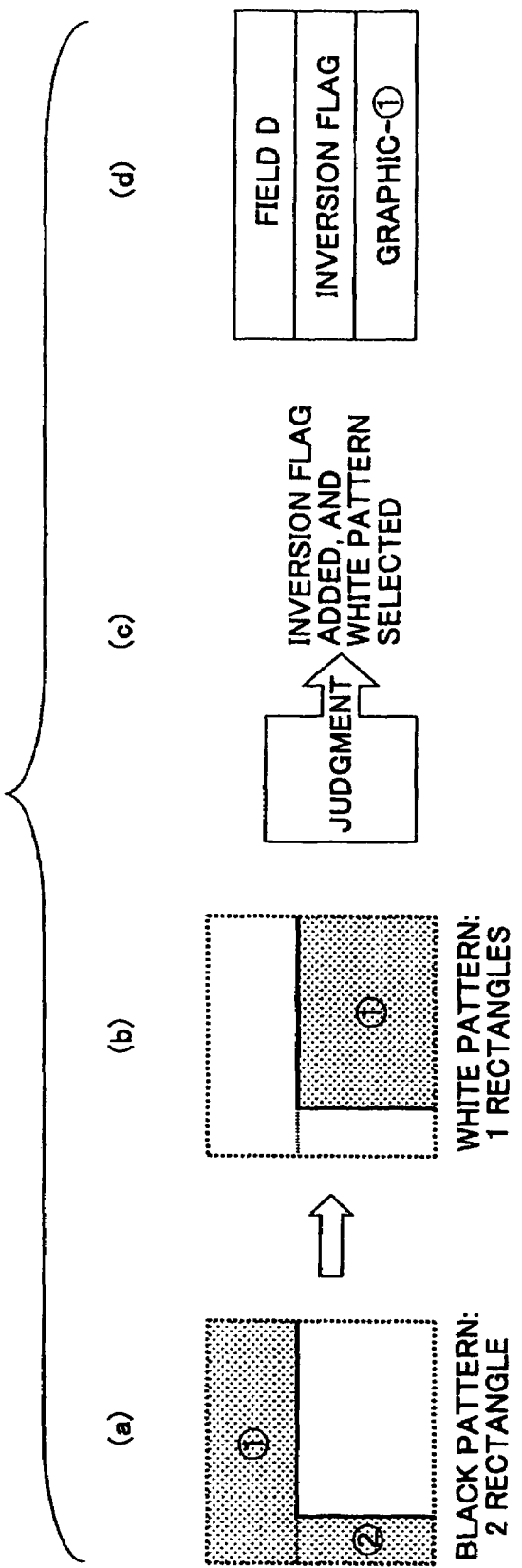
FIG. 8 is a diagram for explaining the example of the processing which is performed for the field D in the graphic pattern data of FIG. 4.

On the other hand, as shown in FIG. 7 and FIG. 8, concerning the field C and the field D, the number of the rectangle patterns contained in the original white pattern is smaller, and the pattern data of the fields of the original white pattern are stored in the inverted image which is the inverted monochrome image of the original graphic pattern (the white pattern is registered). Moreover, the inversion flag information indicating that the original pattern image is inverted is added and recorded together with the pattern data.

According to the above-mentioned processing, the graphic pattern data in which the rectangle dividing is performed for every field can be stored in the required minimal amount, and the amount of data to be stored can be reduced to the amount smaller than that in the conventional case.

Specifically, in the case of the field A of FIG. 5, the number of the rectangle patterns contained in the original black pattern is one, and the number of the rectangle patterns contained in the original white pattern is two. The original black pattern having the smaller number of the rectangle patterns is selected and stored as the pattern data to be stored for the field A. The inversion flag information is not added to the pattern data to be stored.

In the case of the field B of FIG. 6, the number of the rectangle patterns contained in the original black pattern is one, and the number of the rectangle patterns contained in the original white pattern is one. The original black pattern having the same number of the rectangle patterns is selected and stored as the pattern data to be stored for the field B. In this case, the number of the rectangle patterns of the black pattern is the same as the number of the rectangle patterns of the white pattern, and the black pattern with which the black/white inversion processing is unneeded is selected. The inversion flag information is not added to the pattern data to be stored.

In the case of the field C of FIG. 7, the number of the rectangle patterns contained in the original black pattern is three, and the number of the rectangle patterns contained in the original white pattern is one. The original white pattern having the smaller number of the rectangle patterns is selected and stored as the pattern data for the field C. The inversion flag information is added to the pattern data to be stored. Namely, both the pattern data and the inversion flag are stored for the field C.

In the case of the field D of FIG. 8, the number of the rectangle patterns contained in the original black pattern is two, and the number of the rectangle patterns contained in the original white patterns is one. The original white pattern having the smaller number of the rectangle patterns is selected and stored as the pattern data to be stored for the field D. The inversion flag information is added and both the pattern data and the inversion flag are stored for the field D.

Figure 9:
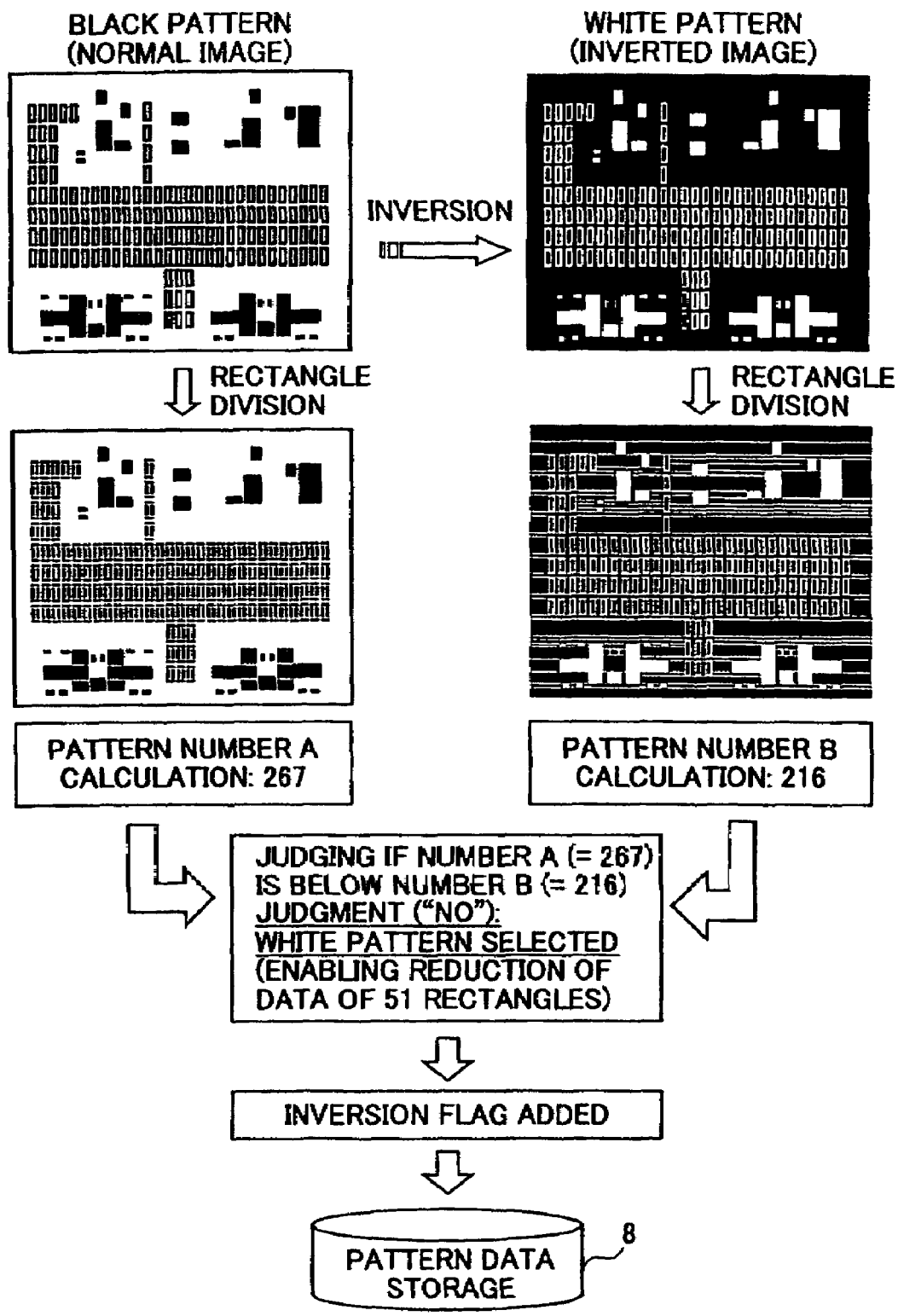
FIG. 9 is a diagram for explaining the example in which the data storage method of the invention is applied to the actual pattern data.

FIG. 9 shows the example in which the data storage method of the invention is applied to the actual pattern data for manufacturing the semiconductor device.

With reference to FIG. 9, the processing procedures of the rectangle dividing and the pattern number calculation for the data of every field after the pattern data is inputted and the field dividing is performed to create the plurality of fields will be explained.

In the example of FIG. 9, the number A of the rectangle patterns contained in the original black pattern (normal image) is 267, and the number B of the rectangle patterns contained in the original white pattern (inverted image) is 216. The white pattern (inverted image) with the smaller number is selected as a result of comparison of the number A and the number B. The inversion flag information is added and the data of the white pattern is stored in the recording medium of the external storage 8.

Accordingly, the pattern data can be stored by making the number of the rectangle patterns into the required minimal number. Specifically, according to the data storage method of the present embodiment, it is possible to store the pattern data in the required minimal amount by reducing the pattern data being stored for the case of the original black pattern by omitting the data of 51 rectangle patterns.

Figure 10:
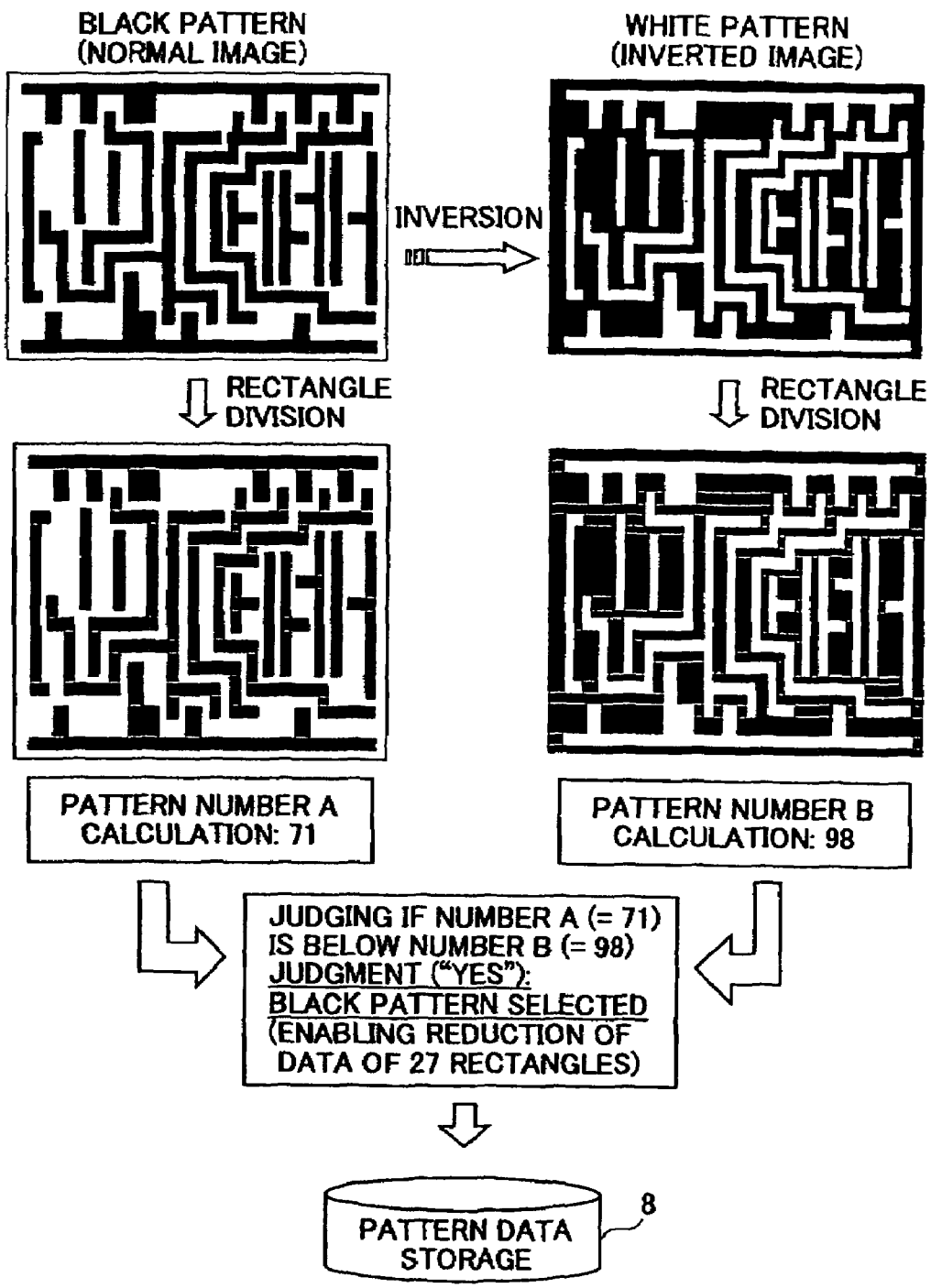
FIG. 10 is a diagram for explaining the example in which the data storage method of the invention is applied to the actual pattern data.

FIG. 10 shows the example in which the data storage method of the invention is applied to the actual pattern data for manufacturing the semiconductor device.

With reference to FIG. 10, the processing procedures of the rectangle dividing and the pattern number calculation for the pattern data for every field after the pattern data is inputted and the field dividing is performed to create the plurality of fields will be explained.

In the example of FIG. 10, the number A of the rectangle patterns contained in the original black pattern (normal image) is 71, and the number B of the rectangle patterns contained in the original white pattern (inverted image) is 98. The black pattern (normal image) with the smaller number is selected as a result of comparison of the number A and the number B. The inversion flag information is not added. The data of the black pattern is stored in the recording medium of the external storage 8.

Accordingly, the pattern data can be stored by making the number of the rectangle patterns to be stored into the necessary minimum number. Specifically, according to the data storage method of the present embodiment, it is possible to store the pattern data in the required minimal amount by reducing the pattern data being stored for the case of the original white pattern by omitting the data of 27 rectangle patterns.

For the sake of convenience of explanation, suppose that the field dividing of the whole pattern data for manufacturing the semiconductor device creates only the two fields shown in FIG. 9 and FIG. 10.

In the conventional data storage method, making a selection of the black pattern data or the white pattern data for storing the pattern data is a fixed selection. If the black pattern data are selected, then the total number of the rectangle patterns contained in the pattern data being stored for the fields of FIG. 9 and FIG. 10 is 338. If the white pattern data are selected, then the number of the rectangle patterns contained in the pattern data being stored for the fields of FIG. 9 and FIG. 10 is 314.

When compared with the case of the conventional data storage method, the total number of the rectangle patterns contained in the pattern data being stored by the data storage method of the present embodiment is 287 for the fields of FIG. 9 and FIG. 10. Specifically, according to the data storage method of the present embodiment, the reduction of the data of 51 rectangle patterns is possible in the case of black pattern selection, and the reduction of the data of 27 rectangle patterns is possible in the case of white pattern selection. Therefore, according to the data storage method of the present embodiment, the whole pattern data can be stored in the required minimal amount.

As described in the foregoing, in the data storage method and device of the present invention, the number of the rectangle patterns after the rectangle dividing is performed is reduced to the required minimal number and such pattern data are stored. Thus, the amount of the pattern data to be stored can be reduced to the amount smaller than in the case of the conventional data storage method. According to the data storage method and device of the invention, making effective use of the resources needed for the data storage is possible, which will contribute to the improvement of the data handling or the shortening of the data transfer time.

The present invention is not limited to the above-described embodiments, and variations and modifications may be made without departing from the scope of the present invention.

What is claimed is:

1. A data storage method which stores pattern data for manufacturing a semiconductor device, comprising the steps of:
   dividing input data having a monochrome pattern into a plurality of fields;
   calculating a first number of rectangles contained in each of the plurality of fields of an original image of the monochrome pattern by dividing each field of the original image into one or plurality of rectangles;
   calculating a second number of rectangles contained in each of the plurality of fields of an inverted image of the monochrome pattern by dividing each field of the inverted image into one or plurality of rectangles;
   selecting, for each field, one of pattern data of the original image and pattern data of the inverted image which has a smaller number of rectangles, by comparing the first number of the rectangles constituting a corresponding field in the original image with the second number of the rectangles constituting a corresponding field in the inverted image; and
   storing the pattern data selected for each field in a recording medium.

2. The data storage method of claim 1 wherein, when the pattern data of the inverted image is selected in the selecting step, inversion flag information is stored in the recording medium together with the pattern data selected for the field concerned in the storing step.

3. The data storage method of claim 2 wherein the inversion flag information indicates that the original image of the monochrome pattern is inverted, and it is detected whether the pattern data, read from the recording medium, indicates the original image or the inverted image depending on presence of the inversion flag information stored for the field concerned.

4. The data storage method of claim 2 wherein, when the pattern data of one of the plurality of fields is read from the recording medium and the presence of the inversion flag information stored for the field is detected, the inversion flag information is used to reproduce the original image of the field by inverting an image of the read pattern data.

5. The data storage method of claim 1 further comprising the step of determining whether one field taken out of the plurality of fields obtained in the dividing step is a final field of the input data.

6. A data storage device which stores pattern data for manufacturing a semiconductor device, comprising:
   a field dividing unit dividing input data having a monochrome pattern into a plurality of fields;
   a first number calculating unit calculating a first number of rectangles contained in each of the plurality of fields of an original image of the monochrome pattern by dividing each field of the original image into one or plurality of rectangles;
   a second number calculating unit calculating a second number of rectangles contained in each of the plurality of fields of an inverted image of the monochrome pattern by dividing each field of the inverted image into one or plurality of rectangles;
   a number comparing unit selecting, for each field, one of pattern data of the original image and pattern data of the inverted image which has a smaller number of rectangles, by comparing the first number of the rectangles constituting a corresponding field in the original image with the second number of the rectangles constituting a corresponding field in the inverted image; and
   a data storing unit storing the pattern data selected for each field in a recording medium.

7. The data storage device of claim 6 wherein the data storing unit is configured to store inversion flag information in the recording medium together with the pattern data selected for the field concerned when the pattern data of the inverted image is selected by the number comparing unit.

8. The data storage device of claim 6 further comprising a final field judging unit determining whether one field taken out of the plurality of fields obtained by the field dividing unit is a final field of the input data.

9. A computer-readable storage medium embodied therein for causing a computer to execute a data storage method which stores pattern data for manufacturing a semiconductor device, the data storage method comprising the steps of:
   dividing input data having a monochrome pattern into a plurality of fields;
   calculating a first number of rectangles contained in each of the plurality of fields of an original image of the monochrome pattern by dividing each field of the original image into one or plurality of rectangles;
   calculating a second number of rectangles contained in each of the plurality of fields of an inverted image of the monochrome pattern by dividing each field of the inverted image into one or plurality of rectangles;
   selecting, for each field, one of pattern data of the original image and pattern data of the inverted image which has a smaller number of rectangles, by comparing the first number of the rectangles constituting a corresponding field in the original image with the second number of the rectangles constituting a corresponding field in the inverted image; and
   storing the pattern data selected for each field in a recording medium.

10. A computer program product embodied therein for causing a computer to execute a data storage method which stores pattern data for manufacturing a semiconductor device, the data storage method comprising the steps of:
    dividing input data having a monochrome pattern into a plurality of fields;
    calculating a first number of rectangles contained in each of the plurality of fields of an original image of the monochrome pattern by dividing each field of the original image into one or plurality of rectangles;
    calculating a second number of rectangles contained in each of the plurality of fields of an inverted image of the monochrome pattern by dividing each field of the inverted image into one or plurality of rectangles;
    selecting, for each field, one of pattern data of the original image and pattern data of the inverted image which has a smaller number of rectangles, by comparing the first number of the rectangles constituting a corresponding field in the original image with the second number of the rectangles constituting a corresponding field in the inverted image; and
    storing the pattern data selected for each field in a recording medium.

* * * * *